(12) United States Patent
Fairhurst et al.

(10) Patent No.: US 8,550,520 B2
(45) Date of Patent: Oct. 8, 2013

(54) METHOD AND APPARATUS FOR MANIPULATING A SUBSTRATE

(75) Inventors: John Robert Fairhurst, Plaistow, NH (US); Jeffrey E. Krampert, Topsfield, MA (US); Richard J. Hertel, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/268,139

(22) Filed: Oct. 7, 2011

(65) Prior Publication Data

US 2013/0088030 A1 Apr. 11, 2013

(51) Int. Cl.
*B66C 1/00* (2006.01)
*B66C 1/54* (2006.01)

(52) U.S. Cl.
USPC ............................................................ 294/93

(58) Field of Classification Search
USPC ................ 294/195, 93–95, 97, 100; 414/941
See application file for complete search history.

(56) References Cited

U.S. PATENT DOCUMENTS

| | | | | | |
|---|---|---|---|---|---|
| 5,449,182 | A | * | 9/1995 | Petralia | 279/2.08 |
| 5,503,446 | A | * | 4/1996 | De Jong | 294/94 |
| 5,829,759 | A | * | 11/1998 | Swain et al. | 279/2.22 |
| 6,010,171 | A | * | 1/2000 | Margiottiello | 294/94 |
| 6,412,846 | B1 | * | 7/2002 | Ostholt | 294/94 |
| 8,128,336 | B2 | * | 3/2012 | Kramp | 414/796.9 |

* cited by examiner

*Primary Examiner* — Stephen Vu

(57) ABSTRACT

A device is disclosed for manipulating a substrate having an inside diameter (ID). The device includes a handle, a trigger that slides within the handle, an alignment shaft and a plurality of substrate supports having distal ends. A plurality of substrate support actuators are connected to the trigger. The trigger can move the plurality of substrate supports between a substrate engaging position and a substrate releasing position through selective engagement of the plurality of substrate supports by the plurality of substrate support actuators. In the substrate engaging position the distal ends of the substrate supports move radially outward to engage the ID of the substrate, enabling the device to hold the substrate without touching the substrate faces. Other embodiments are described and claimed.

13 Claims, 14 Drawing Sheets

METHOD AND APPARATUS FOR MANIPULATING A SUBSTRATE

BACKGROUND OF THE INVENTION

1. Field of the Invention

Embodiments of the present disclosure relate to the field of device manufacturing. More particularly, the present disclosure relates to an improved device for enabling safe and clean handling of substrates without touching the fragile substrate faces.

2. Discussion of Related Art

Attempts have been made to automate the handling and transfer of thin substrates during ion implantation, sputter coating and other processes. Such handling and transfer has been aimed at preventing contamination, abrasion or damage to the substrates and at achieving a high throughput in terms of the number of substrates processed per unit time.

Substrate cassettes are often used to hold a plurality of substrates for storage and transport before and after processing. Automated substrate transfer systems may be employed to remove substrates from the cassette and to place the substrates in a container or carrier for transfer to a processing chamber where one or more deposition, implantation or other treatment processes can be performed on the substrates.

Substrate handling devices are used to transfer individual substrates between a cassette and a transfer container or carrier. A problem with current substrate handlers is that they can contact a portion of the substrate faces. This is undesirable because such contact can cause damage to the substrate faces.

Thus, there is a need for an improved system and method for transferring substrates between cassettes and containers or carriers. The system and method should provide consistent and reliable engagement of the substrate to eliminate substrate face damage that can otherwise occur by dropping, by contact with of the substrate face, or by contacting other substrates.

SUMMARY OF THE INVENTION

A device is provided for enabling stable, safe and clean handling of substrates along their inside diameter (ID) without contacting the substrate faces. The device can engage substrates in a variety of orientations, including but not limited to horizontal or vertical positions.

The device can include a handle, trigger, trigger lock, substrate supports and alignment shaft. A user can grasp the handle to activate the trigger with their thumb to engage a substrate positioned in a horizontal or vertical orientation. Depressing the trigger causes the substrate supports to radially retract or compress together so they can be fit through the substrate ID. Depressing the trigger also sets a trigger lock, which holds the substrate supports in position and eliminates the need for the user to apply constant thumb force to maintain the device in a desired configuration.

To engage a substrate, the retracted/compressed substrate supports can be aligned with the substrate ID, whereupon the trigger lock can be released to enable the disk supports to radially expand to contact the ID of the substrate. The device can then be used to move the substrate to a carrier where it can be held for further processing. To deposit the substrate in a carrier, the device's alignment shaft may aligned with a corresponding alignment feature on a substrate carrier to load the substrate onto the device. When in the desired position is achieved, the trigger can be actuated, retracting the substrate supports to disengage them from the substrate ID, leaving the substrate in place in the carrier.

The trigger may be spring loaded, so that the trigger is automatically returned to a ready position after the trigger lock is released. The trigger lock may also have a spring that sets the lock when the trigger is depressed to the desired position. The substrate support ends may be recessed (e.g., have a "V" shape) so that they can positively retain the ID of the substrate without contacting the substrate faces.

The disclosed device enables a user to pick up a substrate, no matter the orientation (horizontal, vertical or other), without touching the substrate with their hands. It provides a stable platform for moving the substrate while minimizing the chances for substrate slippage, and while eliminating substrate face contact.

Thus, a device is disclosed for manipulating a substrate having an inside diameter (ID). The device includes a handle portion having first and second ends, and a trigger portion slideably received within the handle portion for movement along a longitudinal axis between first and second ends of the handle portion. The handle portion may have an end cap disposed at the first end of the handle portion, where the end cap has a first stop surface for limiting movement of the trigger portion in a first direction along the longitudinal axis. The device may include an alignment shaft disposed at the second end of the handle portion. The alignment shaft may include a second stop surface for limiting movement of the trigger portion in a second direction along the longitudinal axis. The device may also include a plurality of substrate supports engaged with the alignment shaft. The plurality of substrate supports may have distal substrate engaging ends positioned radially away from the alignment shaft. A plurality of substrate support actuators can be connected to the trigger portion, where each of the plurality of substrate support actuators is associated with a respective one of the plurality of substrate supports. The trigger portion may be operable to move the plurality of substrate supports between a substrate engaging position and a substrate releasing position through selective engagement of the plurality of substrate supports by the plurality of substrate support actuators.

A device is disclosed for manipulating a substrate having an inside diameter (ID). The device may include a handle portion having first and second ends, a trigger portion slideably received in the handle portion for movement between the first and second ends, an alignment shaft disposed at the second end of the handle portion, and a plurality of substrate supports engaged with the alignment shaft. The plurality of substrate supports may have distal substrate engaging ends positioned radially away from the alignment shaft. A plurality of substrate support actuators may be movable with the trigger portion, where each of the plurality of substrate support actuators is associated with a respective one of the plurality of substrate supports. The device can have a substrate engaging position in which the trigger portion is positioned toward the first end of the handle portion so that the plurality of substrate support actuators do not contact the plurality of substrate supports and the distal substrate engaging ends are positioned a first radial distance from the alignment shaft. The device can also have a substrate releasing position in which the trigger portion is positioned toward the second end of the handle portion so that the plurality of substrate support actuators engage the plurality of substrate supports to position the distal substrate engaging ends a second radial distance from the alignment shaft, the second radial distance being smaller than the first radial distance.

A method is disclosed for manipulating a substrate having an inside diameter (ID). The method may include positioning a substrate holder adjacent to an ID of a substrate, where the substrate holder having a plurality of movable substrate supports configured in a first position such that the plurality of movable substrate supports is receivable within the ID of the substrate; aligning the plurality of movable substrate supports with the ID of the substrate; and moving the movable substrate supports radially outward into engagement with the ID of the substrate to lock the substrate to the substrate holder.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Figure 1A:
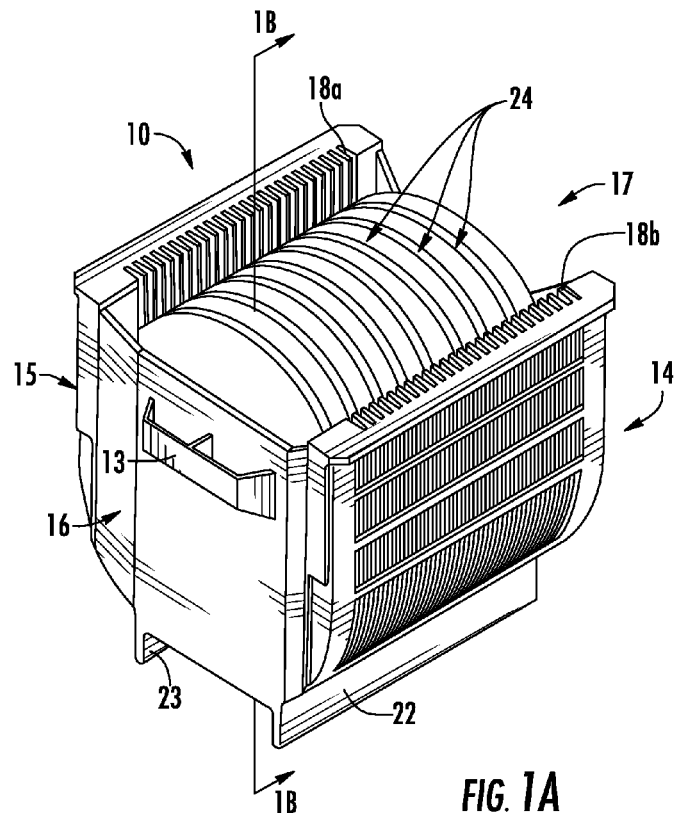
FIGS. 1A and 1B are perspective and cross-section views, respectively, of an exemplary substrate cassette.
Figure 1B:
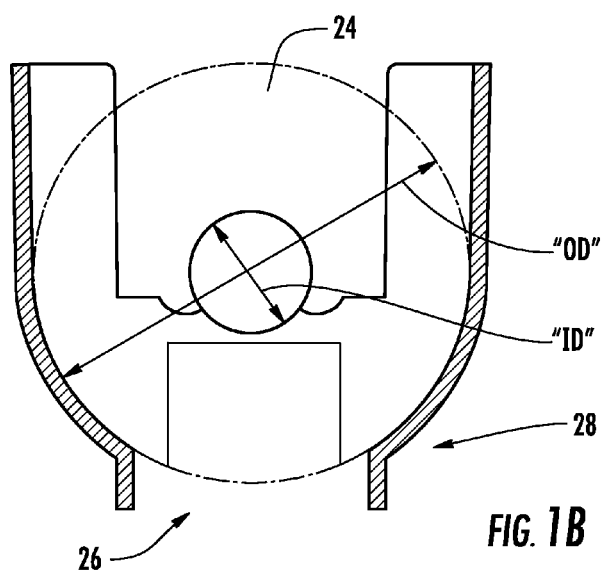

FIGS. 1A and 1B show an exemplary substrate cassette 10 containing a plurality of substrates 24. The cassette 10 may have front and back surfaces 16, 17, first and second sidewalls 14, 15, and pairs of left and right dividers 18a, 18b that receive the substrates. The cassette 10 functions to protect the substrates 24 during transport and storage. The substrates 24 may be subject to one or more processing steps, such as ion implantation or plasma doping. For such processing, the substrates may be transferred from the cassette to another holding device, an example of which is often referred to as a front opening unified pod, or "FOUP." The FOUP may be part of a substrate handling system that manipulates the individual substrates and subjects the substrates to one or more processing steps.

Figure 2:
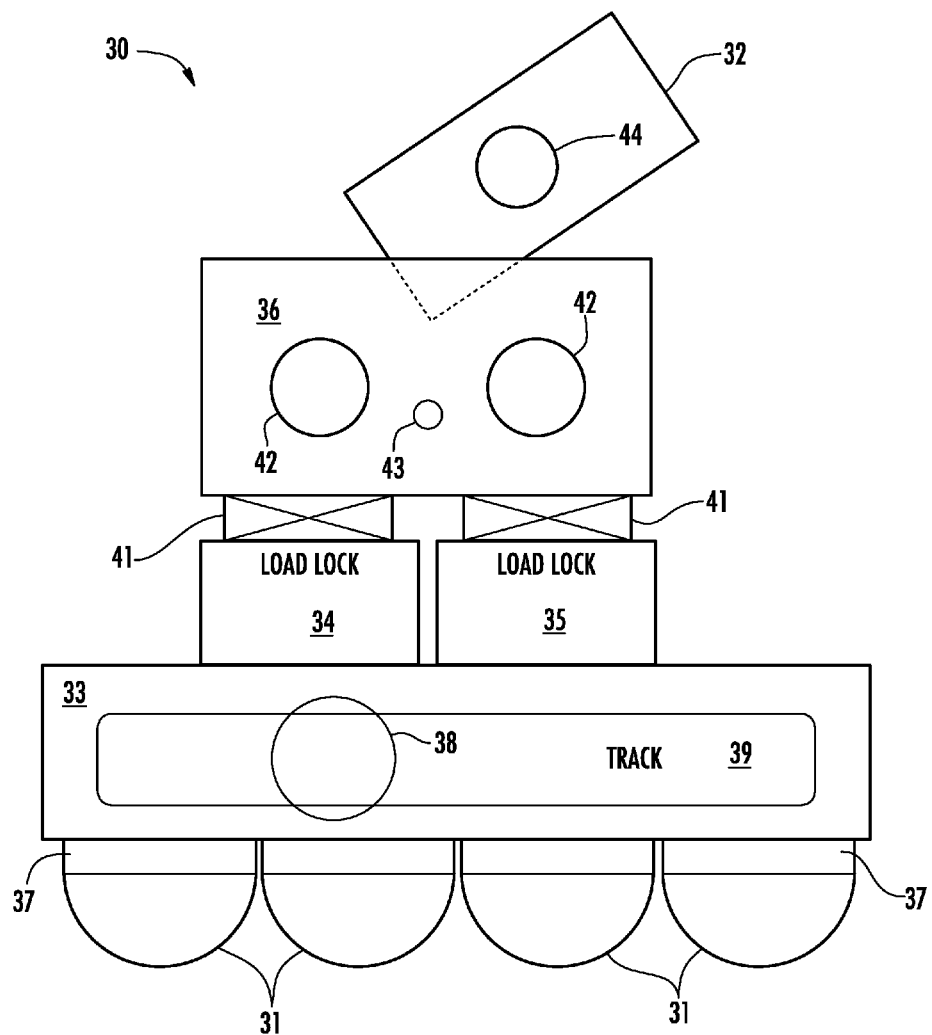
FIG. 2 is a schematic diagram of an exemplary substrate handling system.

FIG. 2 shows an exemplary substrate handling system 30 in which a plurality of FOUPs 31 each can hold a plurality of substrates. The substrates are transferred from the FOUPs 31 to a process chamber 32 via a buffer chamber 33, load locks 34 and 35 and a wafer handler chamber 36. Pod doors 37 interface the between the FOUPs 31 and the buffer chamber 33 so that substrates can pass between the FOUPs 31 and buffer chamber 33. In buffer chamber 33, an atmospheric robot 38 transports wafers along a track 39 to move wafers between the FOUPs 31 and load locks 34 and 35. The buffer chamber 33 may be at or near atmospheric pressure, and provides a controlled, low particulate environment. The load locks 34 and 35 communicate with substrate handler chamber 36 through isolation valves 40 and 41, respectively. The substrate handler chamber 36 may include one or more vacuum robots 42 and a substrate alignment station 43. A substrate is transferred by one of the robots 42 from one of the load locks 34, 35 to substrate alignment station 43. The substrate then is transferred to a process station 44 in process chamber 32 for processing, such as by ion implantation. The same process is reversed to transfer the substrate back to one of the FOUPs.

Figure 3:
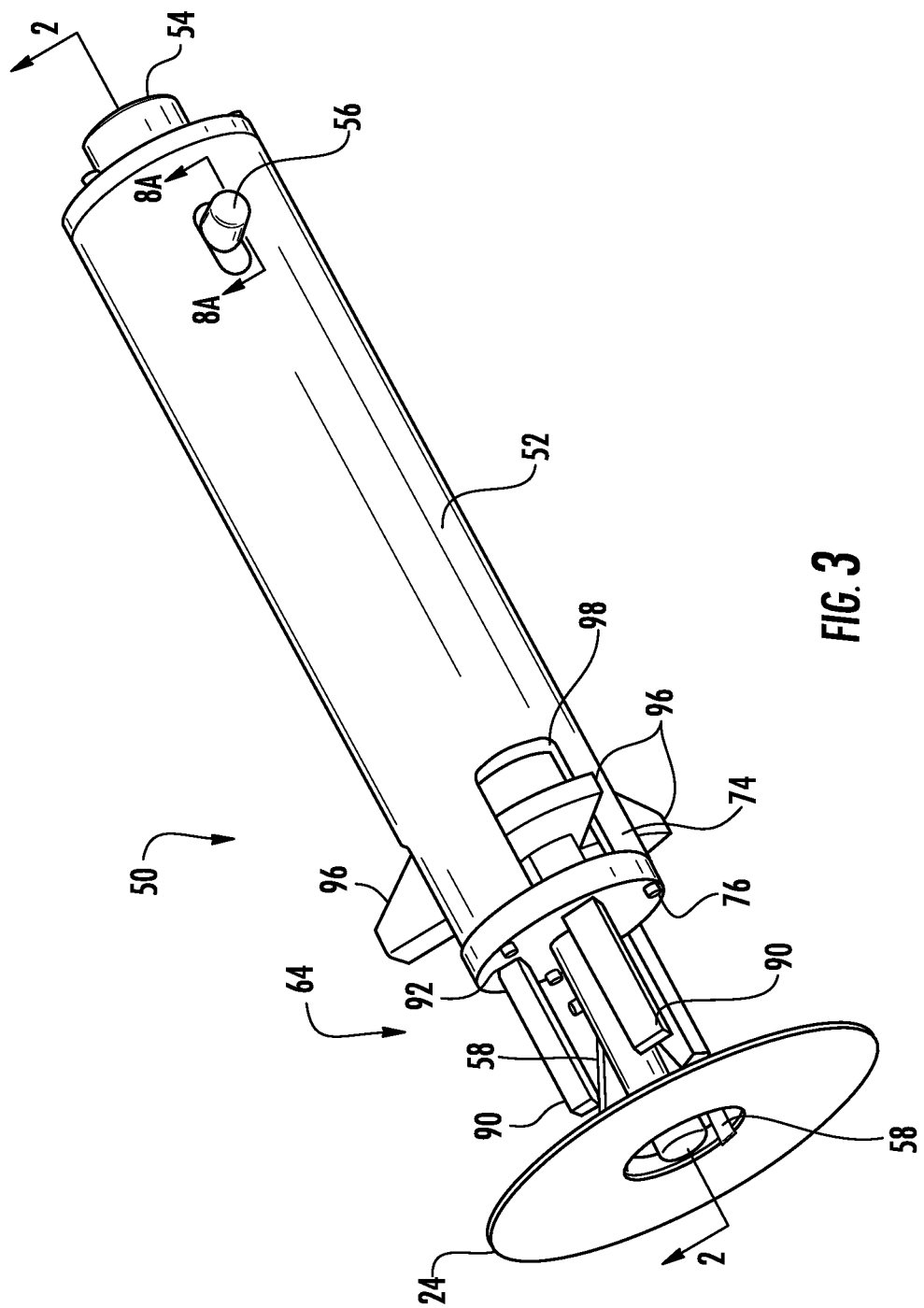
FIG. 3 is a perspective view of the disclosed substrate holder engaged with a single substrate.

FIG. 3 shows an exemplary substrate holder 50 that may be used for transferring substrates 24 between a substrate cassette 10 and a FOUP 31 or other carrier. The holder 50 may include a generally cylindrical handle portion 52, a trigger portion 54, a trigger lock 56, a plurality of substrate supports 58, and an alignment shaft 60. The trigger portion 54 may be slideably received within the handle portion 52, and may have an activation end 62 and an oppositely disposed substrate support engaging end 64. The activation end 62 of the trigger portion may extend outward from a first end 66 of the handle portion while the substrate support engaging end 64 may extend beyond a second end 68 of the handle portion. An end cap 70 may be fixed to the first end 66 of the handle portion 52, and may have an opening 72 through which the activation end 62 of the trigger portion 54 extends.

The alignment shaft 60 may be mounted to the second end 68 of the handle portion 52 and may receive the substrate support engaging end 64 of the trigger portion 54 therethrough. In the illustrate embodiment the alignment shaft 60 has a flange portion 74 that is fixed to the second end 68 of the handle portion using one or more fasteners 76, which may be machine screws or other appropriate fasteners. A shaft portion 78 is connected to the flange portion 74, extending longitudinally away from the handle portion 52. The shaft portion 78 can include a distal nose portion 80 that, as will be described in greater detail later, can be used to align the holder 50 with other substrate handling or holding device such as a lifter or a carrier.

The plurality of substrate supports 58 may be fixed to the shaft portion 78 of the alignment shaft 60 at a first end 82 of each of the supports. In the illustrated embodiment, the first ends 82 of the supports 58 are fixed to the shaft portion 78 using fasteners 84 such as machine screws. The second ends 86 of each of the substrate supports 58 extend radially and longitudinally outward from the shaft portion 78 such that the second ends 86 are disposed at an engaging end 88 of the holder 50. The second ends 86 of the substrate supports 58 act as spring members that are engageable with the ID of a targeted substrate 24. To further facilitate engagement between the holder and a substrate, the second ends 86 of the substrate supports may have a cup shape, v-shape, or other recessed profile that enables the second ends 86 of the supports to cradle the ID of the substrate 24. In the illustrated embodiment, three substrate supports 58 are provided, disposed at approximately 120-degree intervals about the circumference of the holder 50 as viewed along the holder longitudinal axis A-A.

Figure 4:
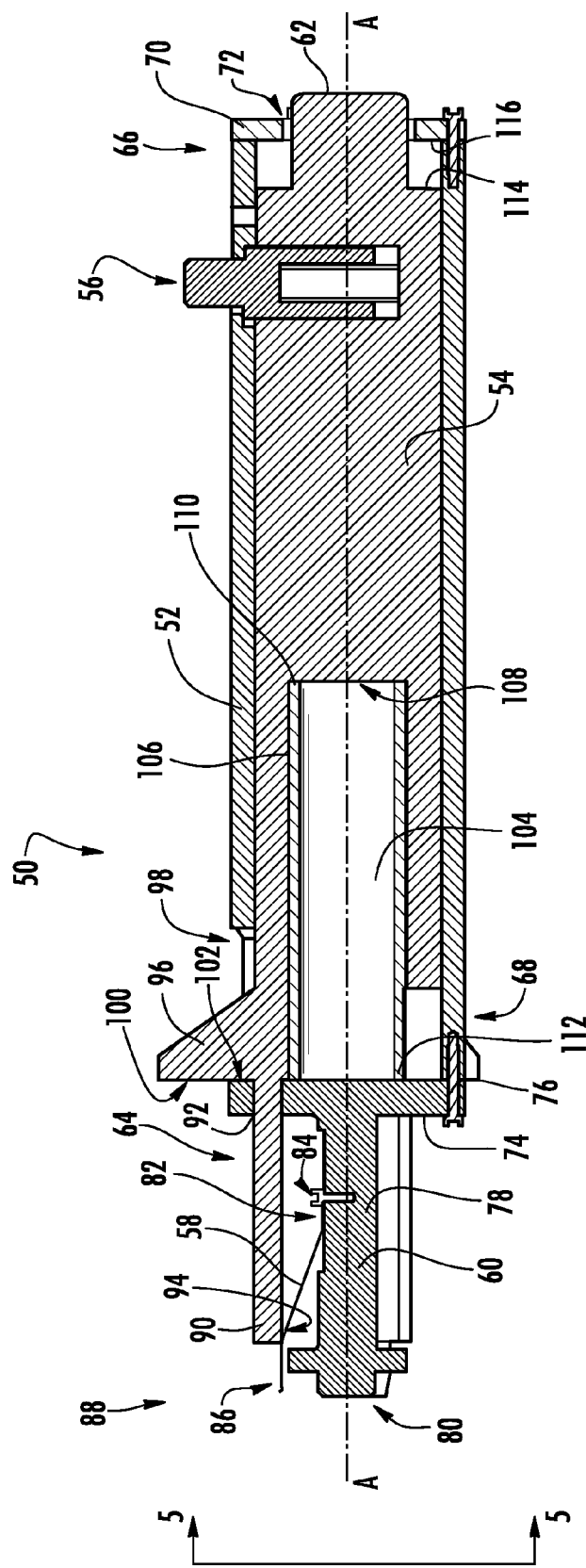
FIG. 4 is a cross-section view of the disclose substrate holder taken along line 4-4 of FIG. 3.
Figure 5:
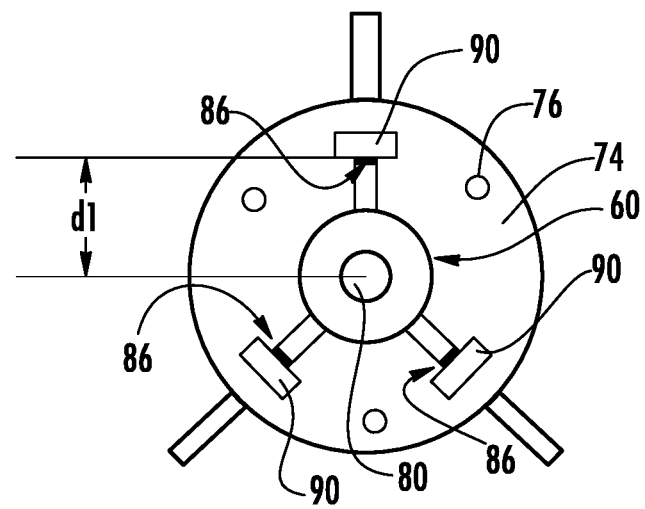
FIG. 5 is an end view taken along line view 5-5 of FIG. 4 showing the substrate supports in the compressed condition.

To selectively force the spring-like substrate supports into and out of engagement with the ID of a substrate, the substrate support engaging end 64 of the trigger portion 54 may include a plurality of substrate support actuators 90 which extend through respective openings 92 formed in the flange portion 74. The substrate support actuators 90 are configured to engage a central portion 94 of each of the substrate supports 58 when the trigger portion is slid toward the second end 68 of the handle portion 52. As can be seen, the substrate supports 58 are relative thin, and as such they act as leaf springs when engaged by a respective substrate support actuator 90. The substrate supports 58 can have a compressed configuration (shown in FIGS. 4 and 5), in which the substrate support actuators 90 are fully extended to engage the substrate supports 58, which forces the supports inward toward the alignment shaft 60. In the compressed configuration the second ends 86 of the substrate supports are positioned a first radial distance "d1" from the center of the alignment shaft 60.

Figure 6:
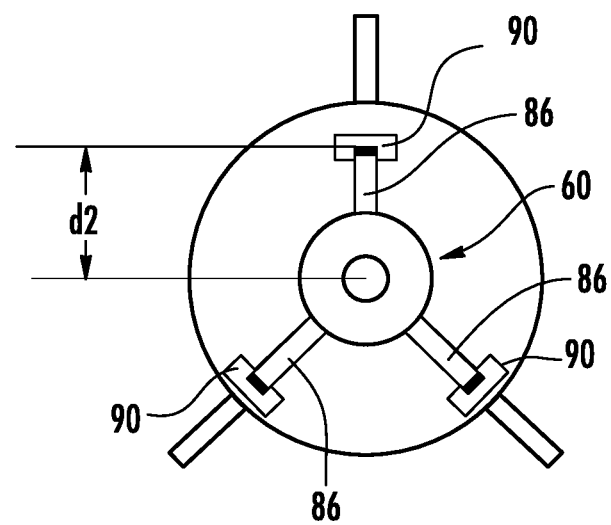
FIG. 6 is an end view similar to that of FIG. 4 showing the substrate supports in the expanded condition.

The substrate supports 58 can also have an expanded configuration (shown in FIGS. 3 and 6) in which the substrate support actuators 90 are retracted so that they do not engage the substrate supports 58, which allows the supports to spring back outward away from the alignment shaft 60. In the expended configuration the second ends 86 of the substrate supports are positioned a second radial distance "d2" form the center of the alignment shaft 60. As can be seen, the second radial distance d2 is greater than the first radial distance d1.

Figure 7A:
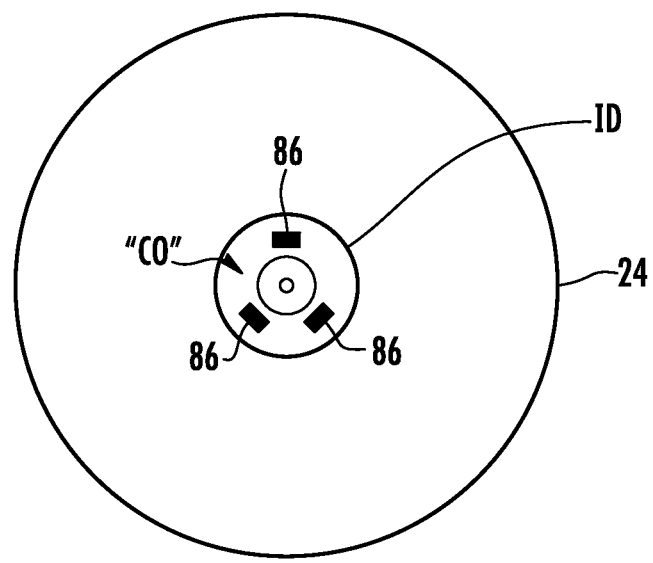
FIGS. 7A and 7B are end views of the holder of FIG. 3 showing the interrelation between the substrate holders and a substrate when the substrate holders are in the compressed and expanded configurations, respectively.
Figure 7B:
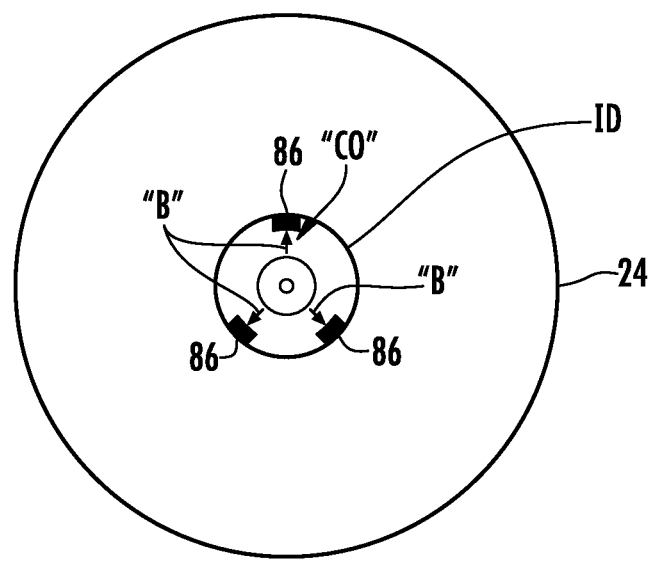

Referring now to FIGS. 7A and 7B, when the substrate supports 58 are in the compressed configuration, the second ends 86 can be inserted into the central opening "CO" of a substrate (FIG. 7A). Once the end second ends 86 of the substrate supports 58 are aligned with the substrate ID, the supports can be moved (in the direction of arrows "B") into the expanded configuration such that the second ends 86 of the supports engage the ID of the substrate 24, locking the substrate to the holder (FIG. 7B). The substrate 24 may then be manipulated as desired by a user grasping the handle potion 52 of the holder 50.

To deposit the substrate 24 in a desired location (e.g., carrier) the substrate supports 58 can be disengaged from the substrate 24 by moving the trigger portion 54 toward the first end 66 of the handle portion 54. This causes the substrate support actuators 90 to move through the openings 92 in the flange portion 74 of the alignment shaft 60 so that they contact the substrate supports 58 to force them inward toward the alignment shaft 60.

To re-engage the substrate, the substrate support actuators may be retracted through the openings 92 in the flange portion 74 of the alignment shaft so that actuators no longer contact the substrate supports 58, enabling them to spring back outward away from the alignment shaft 60. To facilitate this retraction of the substrate support actuators, the trigger portion 54 may include a plurality of arms 96 associated with the plurality of substrate support actuators. These arms 96 may extend radially outward through openings 98 in the handle portion 52. A forward surface 100 of each of the arms 96 may abut a rear surface 102 of the flange portion 74 of the alignment shaft 60. Thus, the arms 96 act as stop surfaces which limit the travel of the substrate support actuators 90 as they compress the substrate supports 58. The arms 96 also can be used to manually retract the substrate support actuators 90. Thus, the arms can be used to slide the substrate support actuators 90 into and out of engagement with the substrate supports 58 to thereby actuate the holder.

Referring again to FIG. 4, the holder 50 may include a spring 104 positioned within the handle portion 52 to bias the trigger portion toward the first end 66 of the housing portion. As will be appreciated, this biases the holder 50 so that the substrate supports 58 are in the expanded (i.e., substrate-engaging) configuration. In one embodiment, the spring 104 is a coil spring disposed in a recess 106 in the trigger portion 54. The recess 106 has a stop surface 108 that engages a first end 110 of the spring 104, while a second end 112 of the spring is engaged by the rear surface 102 of the flange portion 74 of the alignment shaft 60. The trigger portion 54 is constrained in its movement toward the first end 66 of the housing via the interaction between a shoulder 114 of the trigger portion 54 and an inner surface 116 of the end cap 70 that is fixed to the first end 66 of the handle portion 52. Thus arranged, the trigger portion 54 is movable, subject to the bias of the spring 104, along the longitudinal axis A-A of the holder 50 subject to the aforementioned constraints.

Figure 8A:
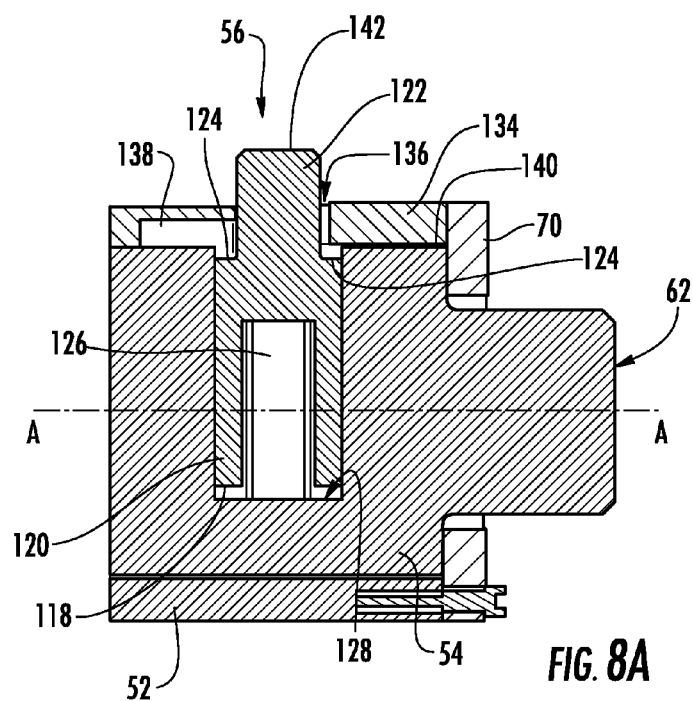
FIG. 8A is a cross section view of an exemplary trigger lock taken along line 8A-8A of FIG. 3.
Figure 8B:
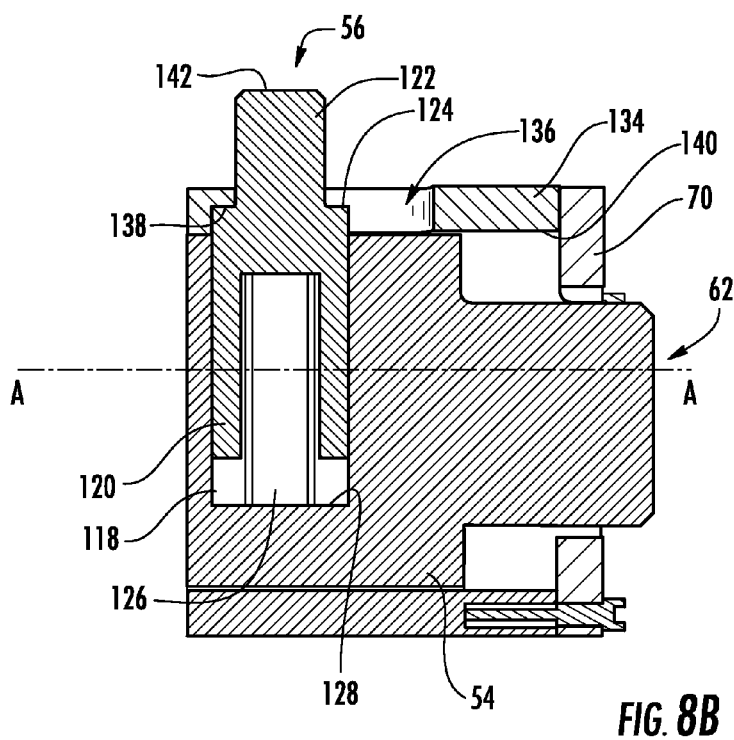
FIG. 8B is an expanded view of a portion of FIG. 4.

FIGS. 8A and 8B illustrate the trigger lock feature of the holder 50, which enables the holder 50 to be locked in position with the substrate supports 58 in the compressed configuration, thus eliminating the need for the user to continually press the trigger portion in order to keep the holder in the compressed configuration. A trigger lock 56 may be slideably disposed in a radially-oriented trigger lock recess 118 formed in the trigger portion 54. The trigger lock 56 may have a stepped configuration in which a first end 120 has a first diameter and an opposite second end 122 has a second diameter that is smaller than the first diameter. The junction between the first and second diameters forms a circumferential shoulder 124. A trigger lock spring 126 may be disposed between an end surface 128 of the trigger lock recess 118 and a trigger lock bore 130 formed in the trigger lock 56 to bias the trigger lock 56 radially outward, away from the trigger portion 54. In one embodiment, the trigger lock spring 126 is a coil spring, though it will be appreciated that other types of springs can also be used.

The handle portion 52 may include a longitudinally oriented keyslot 132 that extends through a wall 134 of the handle portion, and through which the second end 122 of the trigger lock 56 may extend so as to be actuatable by a user via thumb or finger contact.

The keyslot 132 may consist of first and second portions 136, 138. The first portion 136 may be sized to receive only the second end 122 of the trigger lock 56, while the second portion 138 may form a recessed pocket in the wall 134 of the handle portion that receives the first portion as well as the shoulder 124. Thus, arranged, as the trigger portion 54 is being actuated to configure the substrate supports in the compressed position (FIG. 4), the trigger lock 56 moves with the trigger portion 54 toward the second end 68 of the handle portion 52 (along the longitudinal axis A-A). As the trigger lock moves, the circumferential shoulder 124 slides along an inner surface 140 of the handle portion 52 so long as the trigger lock is disposed in the first portion 136 of the keyslot 132 (FIG. 8A). As the trigger lock 56 continues its movement along the longitudinal axis A-A, it encounters the second portion 138 of the keyslot 132. When the trigger lock 56 passes to the second portion of the keyslot, the trigger lock spring 126 the forces the trigger lock to moves radially outward into the recessed pocket of the second portion 138 of the keyslot (FIG. 8B). This radial outward motion captures the trigger lock shoulder 124 in the second portion of the keyslot, locking the trigger lock and the trigger portion 54 in place. In one embodiment, the trigger lock 56 and trigger portion 54 are locked in a position in which the substrate support actuators 90 are in the fully extended position (see FIG. 4), configuring the substrate supports 58 in the compressed position.

To disengage the trigger lock 56, a user can apply sufficient downward force on the top surface 142 of the trigger lock to overcome the bias of the trigger lock spring 126, moving the shoulder 124 out of the pocket of the second portion 138 of the keyslot 132. The bias of trigger spring 104 can then move the trigger portion 54 and trigger lock 56 toward the first end 66 of the handle portion 52, such that the trigger lock is disposed in the first portion 136 of the keyslot once again. In this configuration, the holder 50 may be in the expanded configuration shown in FIG. 3.

Referring now to FIGS. 9A-9G, an exemplary sequence is shown in which the disclosed holder 50 may be used to remove a substrate 24 from an exemplary substrate lifter 150. The holder 50 and lifter 150 may have complementary features to enable the holder 50 to align precisely with a substrate 24 held by the lifter 150. These complementary features ensure a smooth handoff of the substrate 24 from the lifter 150 to the holder 50, minimizing the chance for damage to the substrate. In the illustrated embodiment, a substrate 24 is held in a vertical orientation by lifter 150. Details of such a vertical lifter can be found in related U.S. patent application Ser. No. 13/268,109, titled "Method and Apparatus for Removing a Vertically Oriented Substrate from a Cassette,", the entirety of which is incorporated by reference herein.

The illustrated lifter 150 may engage the substrate 24 along the ID of the substrate via a lifter notch 152. The substrate 24 may be stabilized about its outside diameter OD by a stabilizer 154 positioned adjacent to the substrate OD. The lifter 150 may include a nose slot 156 adjacent to the lifter notch 152. The nose slot 156 is configured to receive the distal nose portion 80 of the holder's alignment shaft 60. In addition, the lifter 150 may include a plurality of support slots 158 (see FIG. 9B) configured to receive the second ends 86 of the substrate supports 58. These features enable the holder 50 to positively engage the lifter 150 to ensure proper repeatable alignment of the holder 50 with the substrate 24. In the illustrated embodiment, the holder 50 includes three substrate supports 58 and a single distal nose portion 80. It will be appreciated that other alignment configurations can also be used. For example, fewer or greater numbers of substrate supports can be used. In addition, it will be appreciated that the holder 50 can be used with a variety of other lifter configurations, and the illustrated embodiment is not limiting in that regard.

Figure 9A:
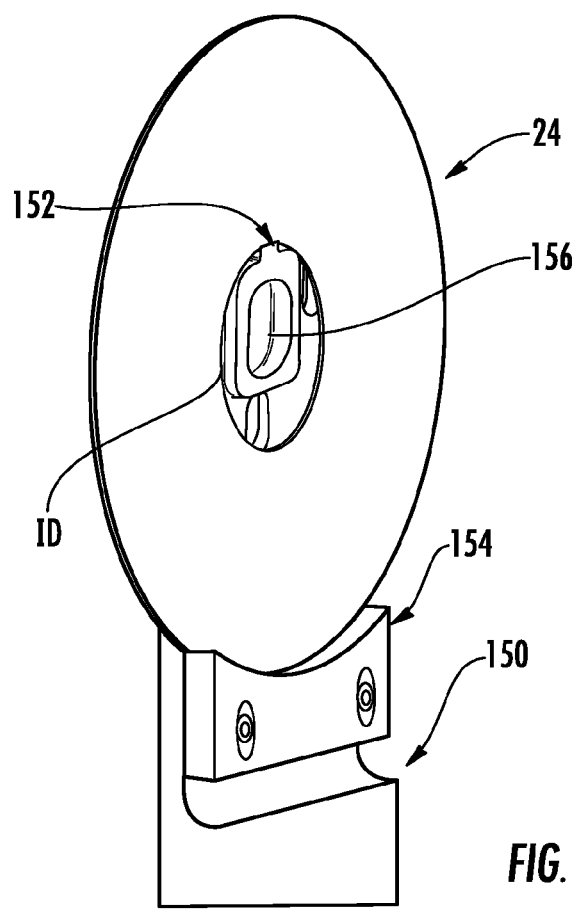
FIG. 9A-9G are series of perspective views illustrating the disclosed substrate holder removing an exemplary substrate from a substrate lifter.
Figure 9B:
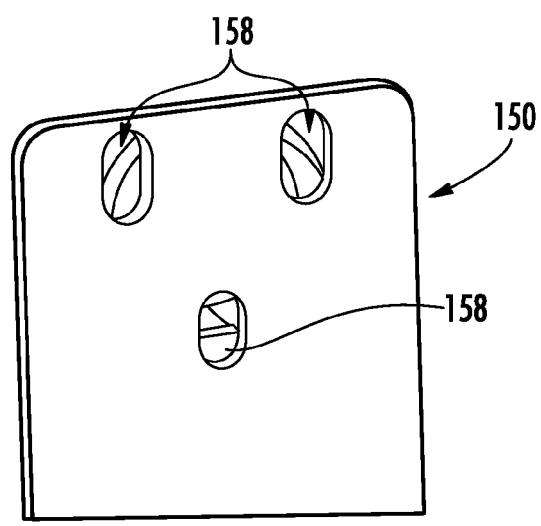
Figure 9C:
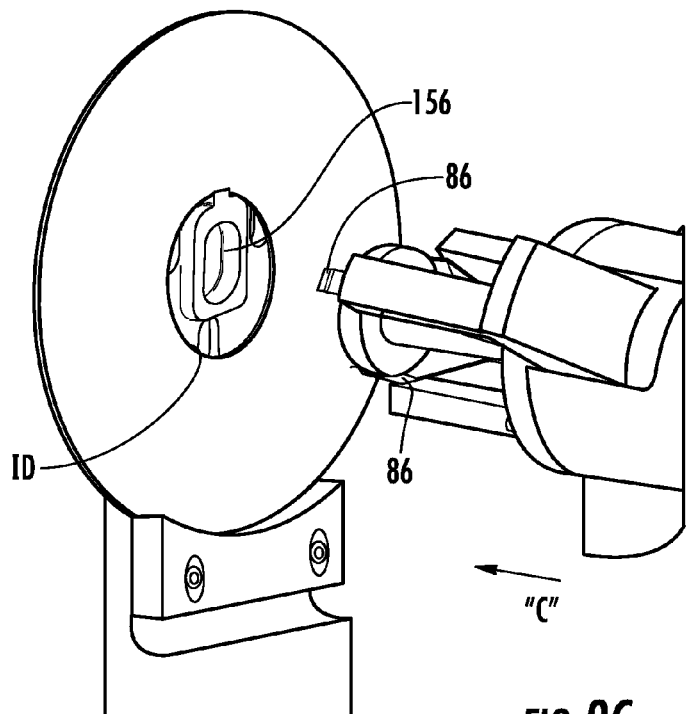
Figure 9D:
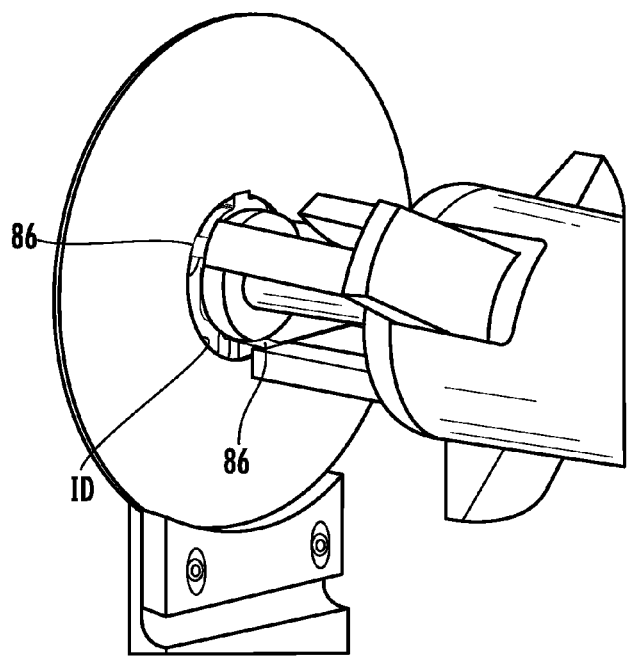
Figure 9E:
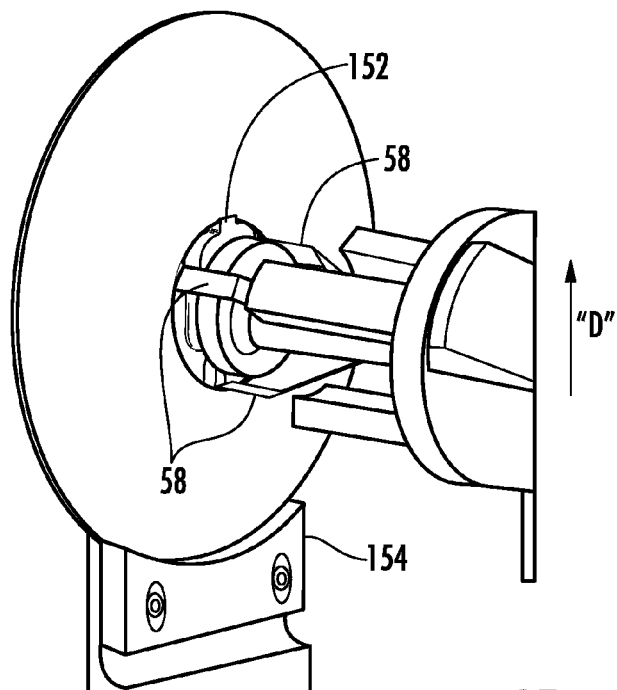
Figure 9F:
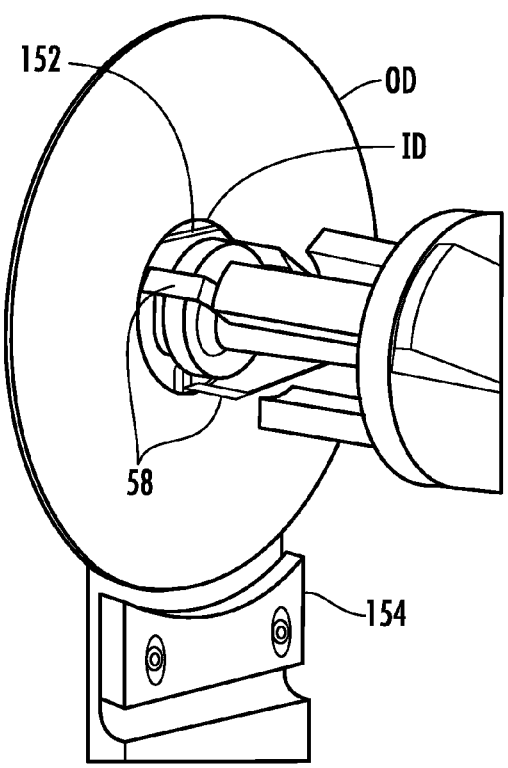

In operation, the holder 50 may be positioned adjacent to the lifter 150, which is engaged with the substrate 24 (see FIG. 9C). In this position, the holder 50 is in the retracted configuration. The holder 50 may then be moved in the direction of arrow "C" such that the distal nose portion 80 and the second ends 86 of the substrate supports 58 are received in the lifter nose slot 156 and support slots 158, respectively (see FIG. 9D). In this position, the second ends 86 of the substrate supports 58 are positioned directly adjacent to the ID of the substrate 24. The holder 50 may then be configured to the expanded configuration so that the second ends 86 of the substrate supports engage the ID of the substrate 24 (see FIG. 9E). The holder 50 may then be moved upward (along the direction of arrow "D") so that the distal nose portion 80 of the holder 50 slides upward within the nose slot 156 and the second ends 86 of the substrate supports 56 slide upward within the support slots 158 of the lifter 150. This upward movement continues until the substrate ID clears the lifter notch 152 and the substrate OD clears the stabilizer 154, disengaging the substrate 24 from the lifter 150 (see FIG. 9F). The holder 50 and substrate 24 may then be moved away from the lifter 150 (see FIG. 9G) to a next process location (e.g., FOUP, etc.)

Referring now to FIGS. 10A-10D, an exemplary carrier 200 is shown for use in holding a plurality of substrates 24 while the substrates undergo one or more processing steps such as ion implantation and the like. The illustrated carrier 200 is generally circular and has a plurality of recesses 210 for receiving respective substrates. As with the lifter 150, the carrier 200 and holder 50 may have complementary features to enable the holder 50 to align precisely with a recess 210 of the carrier 200 to ensure a smooth handoff of the substrate 24 from the holder 50 to the carrier 200, minimizing the chance for damage to the substrate. Details of such a carrier can be found in related U.S. patent application Ser. No. 13/268,123, titled "Method and Apparatus for Holding a Plurality of Substrates for Processing,", the entirety of which is incorporated by reference herein.

Figure 10A:
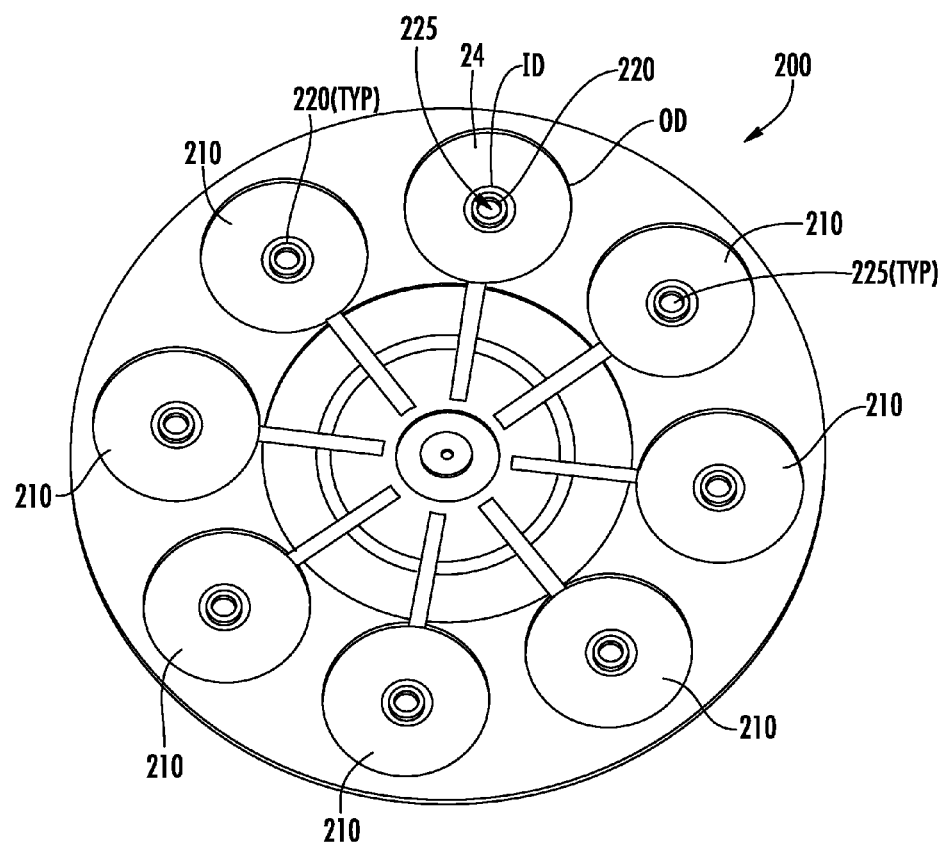
FIG. 10 are series of perspective views illustrating the disclosed substrate holder engaging an exemplary substrate with a substrate carrier.

Referring to FIG. 10A, the carrier 200 may include a plurality of cylindrical recesses 210, where each of the recesses includes a centrally located protrusion 220. The recesses 210 and protrusions 220 are generally sized to receive the OD and ID of the substrate 24. Moreover, the protrusion 220 include centrally located alignment recesses 225 sized and configured to receive the distal nose portion 80 of the alignment shaft 60 of the holder 50. In addition, a top surface 240 of the protrusion 220 may engage a shoulder 81 of the distal nose portion 80. These features enable the holder 50 to axially and radially align the holder 50 to the carrier to facilitate transfer of the substrate 24 therebetween.

Figure 9G:
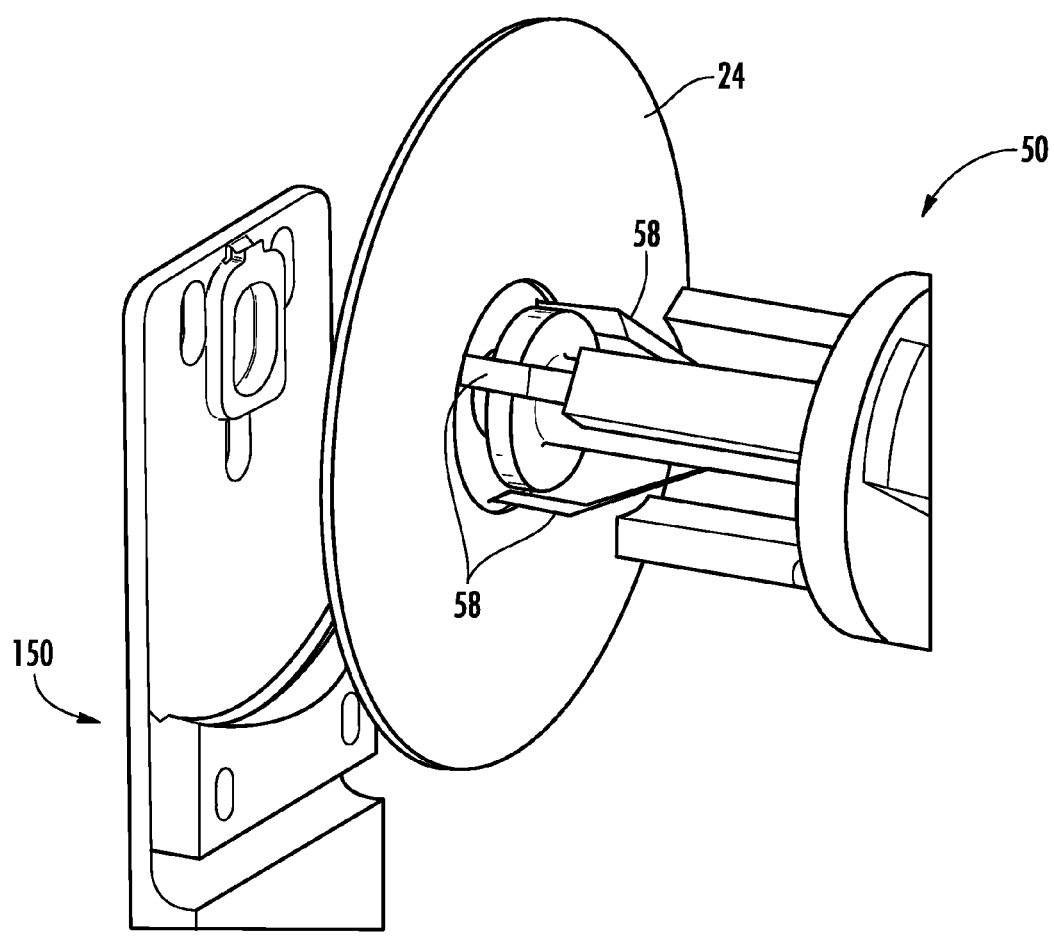
Figure 10B:
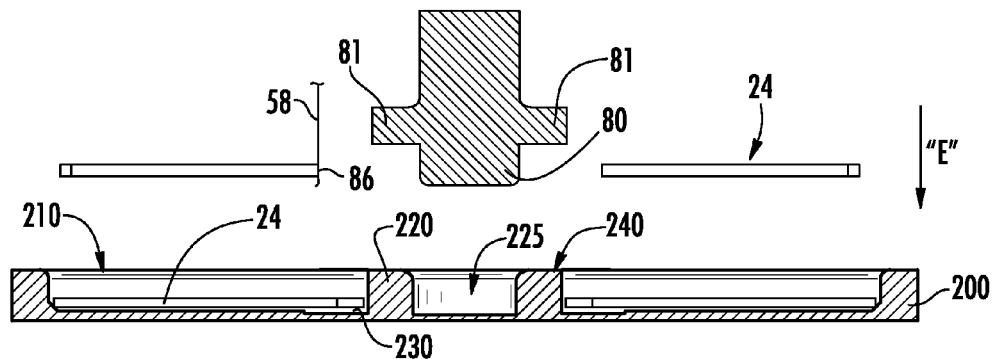
Figure 10C:
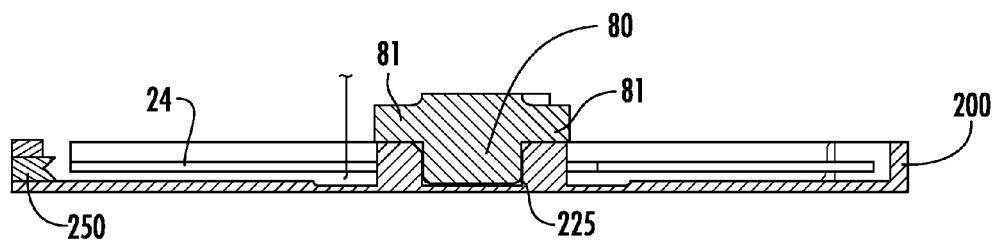
Figure 10D:
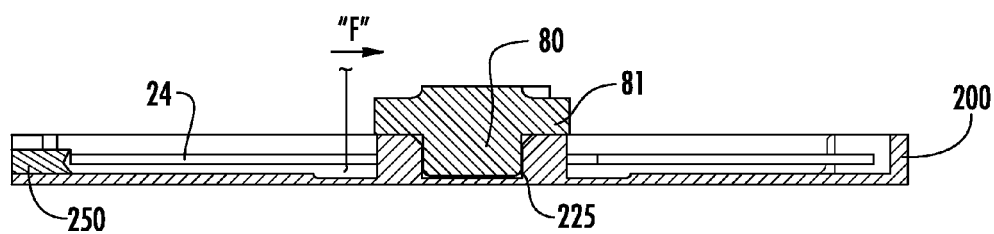

In operation, to transfer a substrate to the carrier the holder 50 may initially be engaged with a substrate (see FIG. 9G). The holder 50 may then be positioned as shown in FIG. 10B so that the distal nose portion 80 is generally aligned with the protrusion 220 and alignment recess 225 associated with a targeted recess 210 of the carrier 200. The distal nose portion 80 may be inserted into the alignment recess 225 of the protrusion 20 by moving the holder in the direction of arrow "E" until the shoulder 81 contacts the top surface 240 of the protrusion 220 (see FIG. 10C). The carrier 200 may then be configured to engage the substrate OD using a notched substrate support arm 250 which can be moved into engagement with the substrate (see FIG. 10D) to lock the substrate 24 to the carrier 200. The holder 50 may then be configured to the retracted position (such that substrate supports 58 move inward in the direction of arrow "F" to disengage the substrate ID). The holder 50 may then be removed, leaving the substrate 24 engaged with the carrier 200. Although it will not be described in detail, it will be appreciated that the substrate 24 may be removed from the carrier 200 using the holder 50 according to a reverse sequence of the previously described steps.

Figure 11:
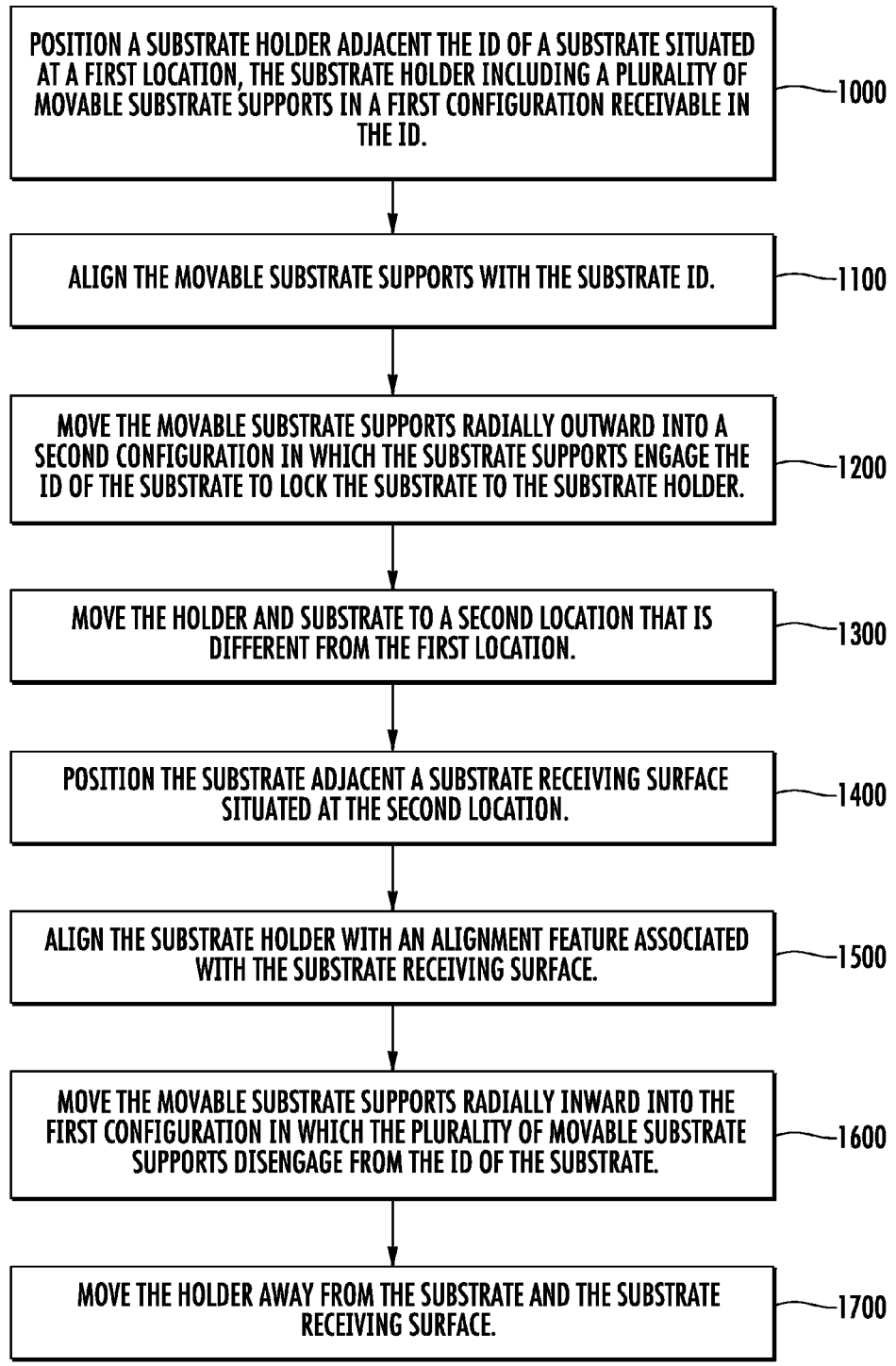
FIG. 11 is an exemplary logic flow implementing an embodiment of the disclosed method.

An exemplary logic flow will now be described in relation to FIG. 11. At step 1000, a substrate holder is positioned adjacent to the ID of a substrate situated at a first location, where the substrate holder includes a plurality of movable substrate supports in a first configuration receivable within the ID of the substrate. At step 1100, the plurality of movable substrate supports are aligned with the ID of the substrate. At step 1200, the plurality of movable substrate supports are moved radially outward into a second configuration in which the substrate supports engage the ID of the substrate, locking the substrate to the substrate holder. At step 1300, the holder and substrate are moved to a second location that is different from the first location. At step 1400, the substrate is positioned adjacent to a substrate receiving surface situated at the second location. At step 1500, the substrate holder is aligned with an alignment feature associated with the substrate receiving surface. At step 1600, the plurality of movable substrate supports are moved radially inward into the first configuration in which the plurality of movable substrate supports disengage from the ID of the substrate. At step 1700, the holder is moved away from the substrate and the substrate receiving surface.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A device for manipulating a substrate having an inside diameter (ID), the device comprising:
    a handle portion having first and second ends, and a trigger portion slidably received, within the handle portion for movement along a longitudinal axis between first and second ends of the handle portion, the handle portion having an end cap disposed at the first end of the handle portion, the end cap having a first stop surface for limiting movement of the trigger portion in a first direction along the longitudinal axis;
    an alignment shaft disposed at the second end of the handle portion, the alignment shaft having a second stop surface for limiting movement of the trigger portion in a second direction along the longitudinal axis;
    a plurality of substrate supports engaged with the alignment shaft, the plurality of substrate supports having distal substrate engaging ends positioned radially away from the alignment shaft; and
    a plurality of substrate support actuators connected to the trigger portion, each of the plurality of substrate support actuators being associated with a respective one of the plurality of substrate supports, and wherein the plurality of substrate support actuators are disposed through a plurality of openings in the second stop surface of the alignment shaft;
    wherein the trigger portion is operable to move the plurality of substrate supports between a substrate engaging position and a substrate releasing position through selective engagement of the plurality of substrate supports by the plurality of substrate support actuators.

2. The device of claim 1, wherein in the substrate engaging position the trigger portion is positioned toward the first end of the handle portion so that the plurality of substrate support actuators do not contact the plurality of substrate supports and the distal substrate engaging ends are positioned a first radial distance from the alignment shaft, and wherein in the substrate releasing position the trigger portion is positioned toward the second end of the handle portion so that the plurality of substrate support actuators engage the plurality of substrate supports and the distal substrate engaging ends are positioned a second radial distance from the alignment shaft, wherein the first radial distance is greater than the second radial distance.

3. The device of claim 1, wherein the distal substrate engaging ends of the plurality of substrate supports have a recess for receiving the ID of the substrate.

4. The device of claim 3, wherein the plurality of substrate supports are disposed in equal spaced apart relation about a circumference of the alignment shaft.

5. The device of claim 1, further comprising a spring positioned between the trigger portion and the alignment shaft for biasing the trigger portion toward the first end of the handle.

6. The device of claim 5, the trigger portion further comprising an activation end extendable through an opening in the end cap of the handle portion to enable an external force to be applied to the trigger portion to overcome the bias of the spring to configure the device in the substrate releasing position.

7. The device of claim 1, the trigger portion further comprising an arm extending radially through an opening in a side of the handle portion, the arm having a surface for enabling a force to be applied to the trigger portion to configure the device in the substrate engaging position.

8. The device of claim 1, the trigger portion comprising a plurality of arms extending radially through a plurality of openings in a side of the handle portion, each of the plurality of arms being associated with a respective one of the plurality of substrate support actuators.

9. A device for manipulating a substrate having an inside diameter (ID), the device comprising:
    a handle portion having first and second ends;
    a trigger portion slidably received in the handle portion for movement between the first and second ends;
    an alignment shaft disposed at the second end of the handle portion, the alignment shaft having a stop surface for limiting movement of the trigger portion;
    a plurality of substrate supports engaged with the alignment shaft, the plurality of substrate supports having distal substrate engaging ends positioned radially away from the alignment shaft; and
    a plurality of substrate support actuators disposed through a plurality of openings in the stop surface of the alignment shaft and movable with the trigger portion, each of the plurality of substrate support actuators being associated with a respective one of the plurality of substrate supports;
    wherein the device has a substrate engaging position in which the trigger portion is positioned toward the first end of the handle portion so that the plurality of substrate support actuators do not contact the plurality of substrate supports and the distal substrate engaging ends are positioned a first radial distance from the alignment shaft; and
    wherein the device has a substrate releasing position in which the trigger portion is positioned toward the second end of the handle portion so that the plurality of substrate support actuators engage the plurality of substrate supports to position the distal substrate engaging ends a second radial distance from the alignment shaft, the second radial distance being smaller than the first radial distance.

10. The device of claim 9, the handle portion having an end cap disposed at the first end of the handle portion, the end cap having a first stop surface for limiting movement of the trigger portion in a first direction along a longitudinal axis between the first and the second end of the handle portion.

11. The device of claim 9, wherein the distal substrate engaging ends of the plurality of substrate supports each has a recess configured to receive a portion of the D of the substrate.

12. The device of claim 9, wherein the plurality of substrate supports comprise leaf springs.

13. The device of claim 9, wherein the plurality of substrate supports engage the ID of the substrate without touching a face of the substrate.

* * * * *

UNITED STATES PATENT AND TRADEMARK OFFICE
CERTIFICATE OF CORRECTION

PATENT NO. : 8,550,520 B2  
APPLICATION NO. : 13/268139  
DATED : October 8, 2013  
INVENTOR(S) : John Robert Fairhurst et al.

Page 1 of 1

It is certified that error appears in the above-identified patent and that said Letters Patent is hereby corrected as shown below:

In the Claims

Column 11, Line 14, Claim 11, "D"

Should be changed to --ID--

Signed and Sealed this  
Thirty-first Day of December, 2013

Margaret A. Focarino  
*Commissioner for Patents of the United States Patent and Trademark Office*